(12) United States Patent
Hsiao

(10) Patent No.: US 7,808,281 B1
(45) Date of Patent: Oct. 5, 2010

(54) DIFFERENTIAL COMMON MODE LOGIC DRIVER WITH SWITCHING CONTROL CIRCUIT

(75) Inventor: Hui-Fang Hsiao, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 0 days.

(21) Appl. No.: 12/632,756

(22) Filed: Dec. 7, 2009

(51) Int. Cl.
*H03K 19/20* (2006.01)

(52) U.S. Cl. .................................. 326/115; 326/83

(58) Field of Classification Search ............. 326/112, 326/155, 80–87
See application file for complete search history.

(56) References Cited

U.S. PATENT DOCUMENTS 7,521,976 B1 * 4/2009 Sudjian et al. ............. 327/199
7,656,204 B2 * 2/2010 Henzler et al. ............. 327/115

* cited by examiner

*Primary Examiner*—Don P Le
(74) *Attorney, Agent, or Firm*—Winston Hsu; Scott Margo; Min-Lee Teng

(57) ABSTRACT

A differential CML driver includes an output stage, a control circuit and a reference circuit. The output stage includes a first loading component, a second loading component, a bias component, a first metal-oxide-semiconductor (MOS) transistor and a second MOS transistor. The control circuit is coupled to the output stage and is for receiving a reference bias voltage, a first input signal and a second input signal to make one of the first and the second MOS transistor enter a cut-off region and the other of the first and the second MOS transistor enter a saturation region. The reference circuit is coupled to the output stage and the control circuit, and is for generating a common-mode voltage according to first and second output voltages of the output stage, and outputting the reference bias voltage to the control circuit according to the common-mode voltage.

16 Claims, 5 Drawing Sheets

DIFFERENTIAL COMMON MODE LOGIC DRIVER WITH SWITCHING CONTROL CIRCUIT

BACKGROUND OF THE INVENTION

1. Field of the Invention

The present invention relates to a driver circuit, and more particularly, to a differential common mode logic driver with a switching control circuit.

2. Description of the Prior Art

Common mode logic (CML) drivers are usually adopted to provide a driving voltage from stage to stage. However, a conventional CML driver often suffers from problems such as incomplete transition from a cut-off region to a linear region of the inherent switching transistors and common mode voltage variation.

Please refer to FIG. 1, which is a diagram of a conventional CML driver 100. Two metal-oxide-semiconductor (MOS) transistors NA1 and NA2 serve as switching transistors to conduct currents IA1 and IA2 alternately according to a pair of input voltages VinA1 and VinA2. Usually, the input voltages VinA1 and VinA2 are paired differential signals. Therefore, when the input voltage VinA1 goes high, the MOS transistor NA1 enters a linear or saturation region and conducts the current IA1 equal to a common current IA; meanwhile, the input voltage VinA2 goes low and the MOS transistor NA2 enters a cut-off region and conducts no current at all (in an ideal case). However, the input voltage VinA1 may not be sufficient to drive the MOS transistor NA1 into the saturation region. Thus, the MOS transistor NA1 stays in the linear region rather than the saturation region, leading to a small output impedance of the CML driver and therefore a poor driving performance.

Additionally, the conventional CML driver 100 also suffers from another drawback in a practical operation. When the output signals of the conventional CML driver 100 encounter a transition (e.g., one of the output voltages goes from high to low while the other goes from low to high), a common mode voltage of the output signals may also vary with the transition. Consequently, electromagnetic interference (EMI) occurs, leading to a degradation in performance and the stability of the output signals.

Therefore, it is crucial to ensure a stable common mode voltage at the output terminals of a CML driver.

SUMMARY OF THE INVENTION

One of the objectives of the present invention is therefore to provide a differential CML (common mode logic) driver capable of solving the problems encountered in conventional CML drivers.

According to an embodiment of the present invention, a differential CML driver is provided. The differential CML driver includes: an output stage, a control circuit and a reference circuit. The output stage includes: a first loading component, a second loading component, a bias component, a first metal-oxide-semiconductor (MOS) transistor and a second MOS transistor. The control circuit is coupled to the output stage and is for receiving a reference bias voltage, a first input signal and a second input signal to make one of the first MOS transistor and the second MOS transistor enter a cut-off region and the other of the first MOS transistor and the second MOS transistor enter a saturation region. The reference circuit is coupled to the output stage and the control circuit and is for generating a common-mode voltage according to the first output voltage and the second output voltage of the output stage, and outputting the reference bias voltage to the control circuit according to the common-mode voltage.

According to another embodiment of the present invention, a differential CML driver is provided. The differential CML driver includes: an output stage, a control circuit and a reference circuit. The output stage includes: a first loading component, a second loading component, a bias component, a first MOS transistor and a second MOS transistor. The control circuit includes: a first bias component, a second bias component, a first input transistor, a second input transistor, a first driving transistor and a second driving transistor, wherein a bias current of the control circuit has a specific proportional relationship with a bias current of the output stage. The reference circuit is coupled to the output stage and the control circuit, and is for generating a common-mode voltage according to the first output voltage and the second output voltage of the output stage, and outputting the reference bias voltage to the control circuit according to the common-mode voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
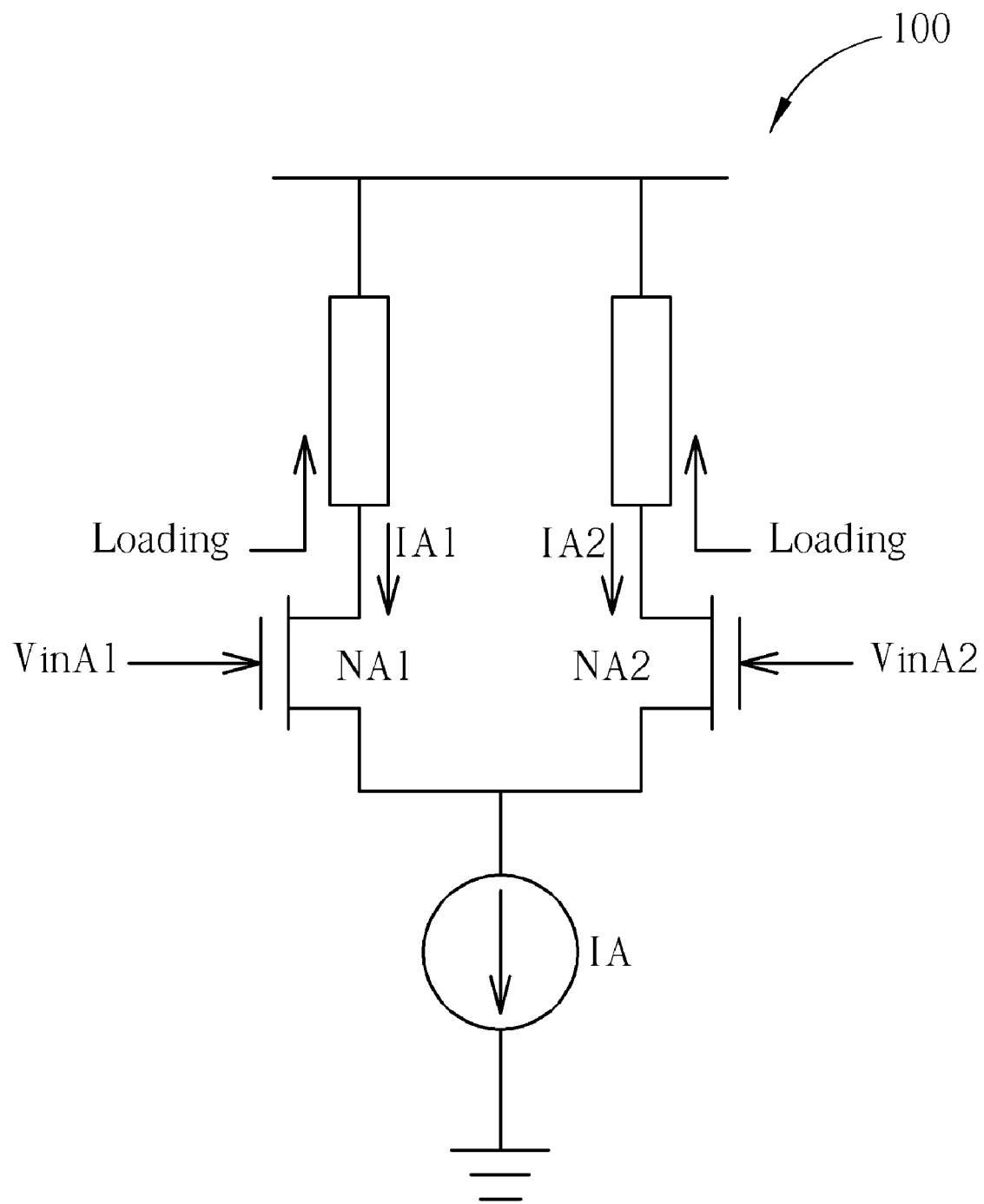
FIG. 1 is a diagram of a conventional common mode logic driver.
Figure 2:
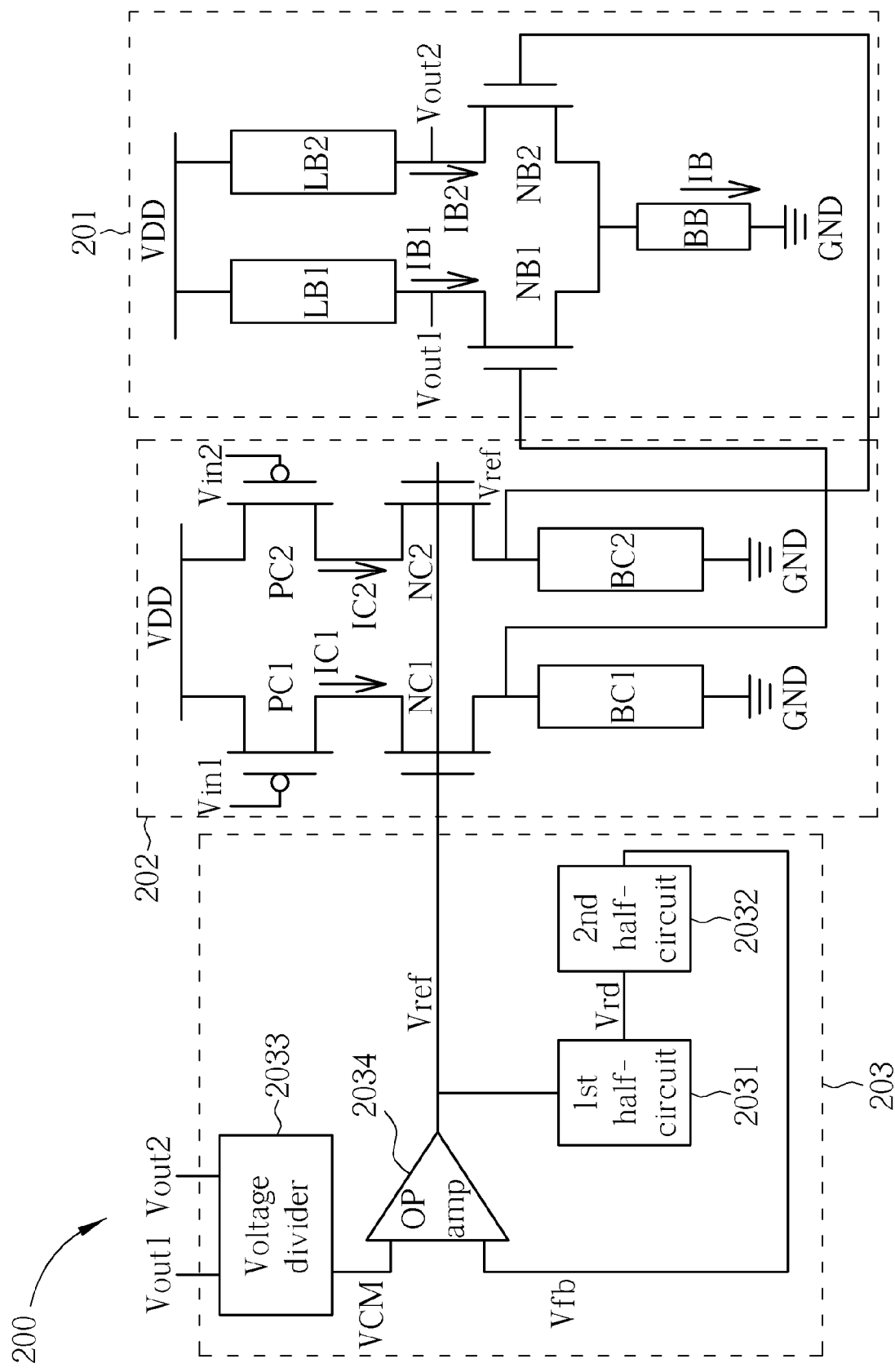
FIG. 2 is a diagram of a common mode logic driver according to an embodiment of the present invention.

Please refer to FIG. 2 for a detailed understanding of the present invention. FIG. 2 is a diagram of a CML driver 200 according to an embodiment of the present invention. The exemplary CML driver 200 includes, but is not limited to, an output stage 201, a control circuit 202 and a reference circuit 203. The output stage 201 includes: a first loading component LB1, a second loading component LB2, a bias component BB, a first metal-oxide-semiconductor (MOS) transistor NB1 and a second MOS transistor NB2. The first loading component LB1 has a first node coupled to a first reference voltage (e.g., a supply voltage VDD in this embodiment) and a second node for outputting a first output voltage Vout1. The second loading component LB2 has a first node coupled to the first reference voltage and a second node for outputting a second output voltage Vout2. The bias component BB (e.g., a current source) has a first node for conducting a bias current IB and a second node coupled to a second reference voltage (e.g., a reference ground GND in this embodiment). The first MOS transistor NB1 has a control node for receiving a first driving signal Vdr1, a first node coupled to the second node of the first loading component LB1 and a second node coupled to the first node of the bias component BB. The second MOS transistor NB2 has a control node for receiving a second driving signal Vdr2, a first node coupled to the second node of the second loading component LB1 and a second node coupled to the first node of the bias component BB.

The control circuit 202 is coupled to the output stage 201 and is for receiving a reference bias voltage Vref, a first input signal Vin1 and a second input signal Vint to make one of the first MOS transistor NB1 and the second MOS transistor NB2 enter a cut-off region and the other of the first MOS transistor NB1 and the second MOS transistor NB2 enter a saturation region. The reference circuit 203 is coupled to the output stage 201 and the control circuit 202 and is for generating a common-mode voltage VCM according to the first output voltage Vout1 and the second output voltage Vout2 of the output stage 201, and outputting the reference bias voltage Vref to the control circuit 202 according to the common-mode voltage VCM.

Please refer to FIG. 2 again for a detailed illustration of the control circuit 202. The control circuit 202 comprises a first bias component BC1, a second bias component BC2, a first input transistor PC1, a second input transistor PC2, a first driving transistor NC1 and a second driving transistor NC2. The first bias component BC1 has a first node to drain a first input current IC1 and a second node coupled to the second reference voltage, i.e., a reference ground GND, wherein the first input current IC1 is proportional to the bias current IB of the output stage 201 by a first specific ratio R1. The second bias component BC2 has a first node to drain a second input current IC2 and a second node coupled to the second reference voltage, wherein the second input current IC2 is proportional to the bias current IB of the output stage 201 by the first specific ratio R1. The first input transistor PC1 has a control node for receiving the first input signal Vin1, a first node coupled to the first reference voltage (i.e., VDD) and a second node for delivering the first input current IC1. The second input transistor PC2 has a control node for receiving the second input signal Vint, a first node coupled to the first reference voltage (i.e., VDD), and a second node for delivering the second input current IC2. The first driving transistor NC1 has a control node for receiving the reference bias voltage Vref from the reference circuit 203, a first node coupled to the second node of the first input transistor PC1, and a second node for delivering the first driving signal Vdr1 to the first MOS transistor NB1 of the output stage 201, wherein an aspect ratio of the first driving transistor NC1 is proportional to an aspect ratio of the first MOS transistor NB1 of the output stage 201 with the first specific ratio R1. The second driving transistor NC2 has a control node for receiving the reference bias voltage Vref from the reference circuit 203, a first node coupled to the second node of the second input transistor PC2, and a second node for delivering the second driving signal Vdr2 to the second MOS transistor NB1 of the output stage 201, wherein an aspect ratio of the second driving transistor is proportional to an aspect ratio of the second MOS transistor NB1 of the output stage 201 by the first specific ratio R1.

Please note that the components within the control circuit 202 are specifically designed to match the components within the output stage 201 by the first specific ratio R1 such that it can be assured that one of the first MOS transistor NB1 and the second MOS transistor NB2 of the output stage 201 is in the saturation region when driven. For example, when the first input signal Vin1 is high and the second input signal Vin2 is low, the second input transistor PC2 of the control circuit 202 is conducting the second input current IC2 which has the proportional relationship (e.g., the first specific ratio R1) with the current IB2 the second MOS transistor NB2 of the output stage 201 is conducting. Since the aspect ratio of the second MOS transistor NB2 matches that of the second input transistor PC2 by the same first specific ratio R1 as well as the currents they conduct, it can be deducted that the second MOS transistor NB2 operates in the saturation region as does the second driving transistor NC2. Since the first input signal Vin1 is high, the control circuit 202 sends the second driving signal Vdr2, which is low compared with the first driving signal Vdr1, to the output stage 201, therefore the first input transistor PC1 enters the cut-off region and conducts zero current (IB1=0, since IB2=IB). Likewise, when the first input signal Vin1 is low and the second input signal Vin2 is high, the operation of the first driving transistor NC1 of the control circuit 202 ensures that the first MOS transistor NB1 enters the saturation region.

In this embodiment, the bias component BB of the output stage 201 and the first and the second bias components BC1 and BC2 of the control circuit 202 are realized by current sources instead of conventional resistors, and the purpose of this design is to prevent the influence of resistance variation due to process. In this way, a more stable driving circuit can be achieved.

The CML structure may suffer from another drawback in a practical operation. When the first and the second output voltages Vout1 and Vout2 encounter a transition (e.g., the first output voltage Vout1 goes from high to low while the second output voltage Vout2 goes from low to high), a common mode voltage of the first and the second output voltages Vout1 and Vout2 may also vary with the transition, leading to a degradation in performance and stability of the output signals.

The exemplary embodiment of the present invention therefore provides an additional reference circuit 203 for supplying a stable reference signal to ensure the common mode voltage at the output terminals of the output stage 201. Please refer to FIG. 2 again. The reference circuit 203 includes a voltage divider 2033, an operational amplifier (OP amp) 2034, a first half-circuit 2031 and a second half-circuit 2032. The voltage divider 2033 is for receiving the first output voltage Vout1 and the second output voltage Vout2 of the output stage 201 to generate the common-mode voltage VCM which is proportional to an average of the first output voltage Vout1 and the second output voltage Vout2 of the output stage 201. The OP amp 2034 is for receiving the common-mode voltage VCM and a feedback voltage Vfb to generate the reference bias voltage Vref. The first half-circuit 2031, which is designed to be a duplicate of the output stage 201, is for receiving the reference bias voltage Vrb to generate a reference driving voltage Vrd. The second half-circuit, which is designed to be a duplication of the control circuit 202, is for receiving the reference driving voltage Vrd to generate the feedback voltage Vfb.

Figure 3:
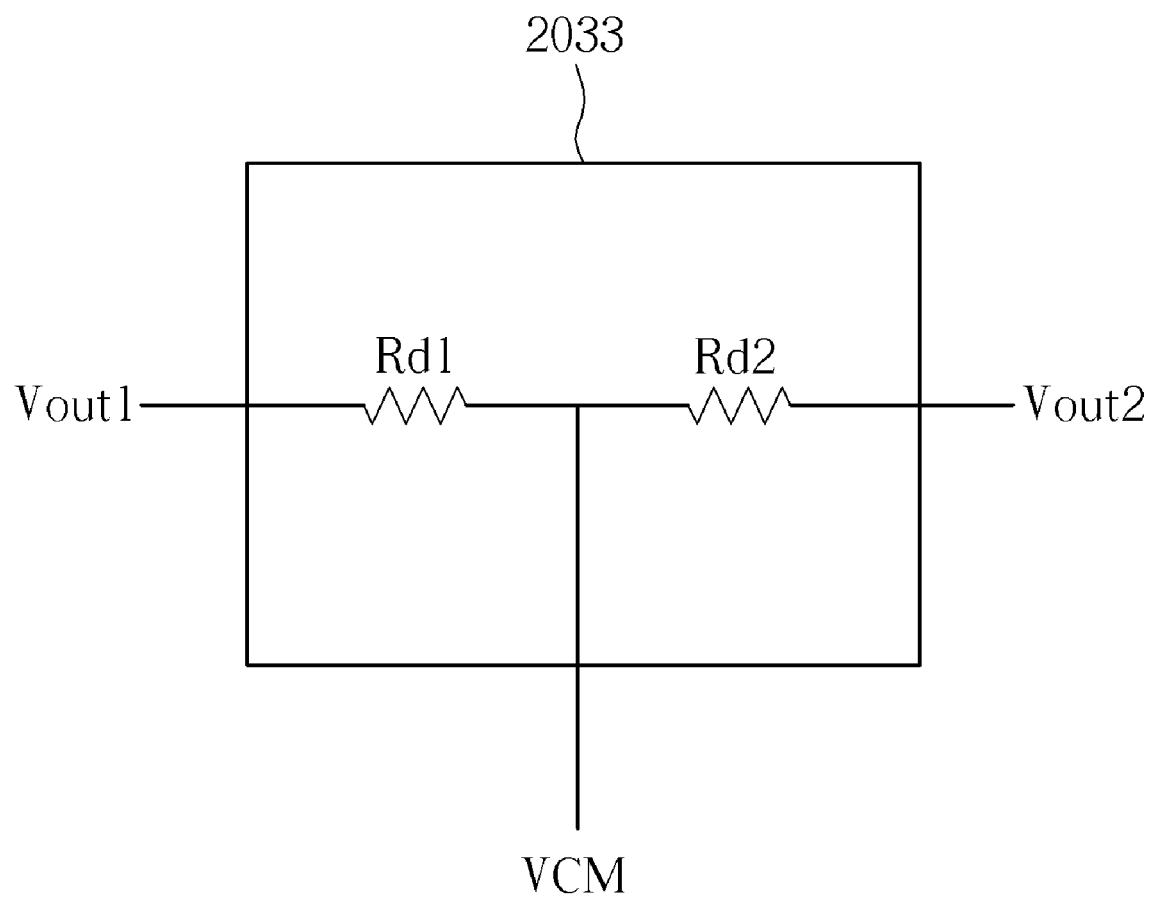
FIG. 3 is a diagram of a voltage divider in FIG. 2 according to an embodiment of the present invention.

Please refer to FIG. 3 for a more detailed illustration of the voltage divider 2033 of this embodiment. FIG. 3 is a diagram of the voltage divider 2033 in FIG. 2. The voltage divider 2033 is composed of two identical resistors Rd1 and Rd2. When receiving the first output voltage Vout1 and the second output voltage Vout2, the voltage divider 2033 voltage-divides the first and second output voltages Vout1, Vout2 and delivers the common-mode voltage VCM which is an average value of the first and the second output voltages Vout1 and Vout2. Please note that this example is for illustrative purposes only, and is not supposed to be a limitation of the present invention. BY way of example, the components of the voltage divider 2033 can also be two identical capacitors, and this variation in design also falls within the scope of the present invention.

Figure 4:
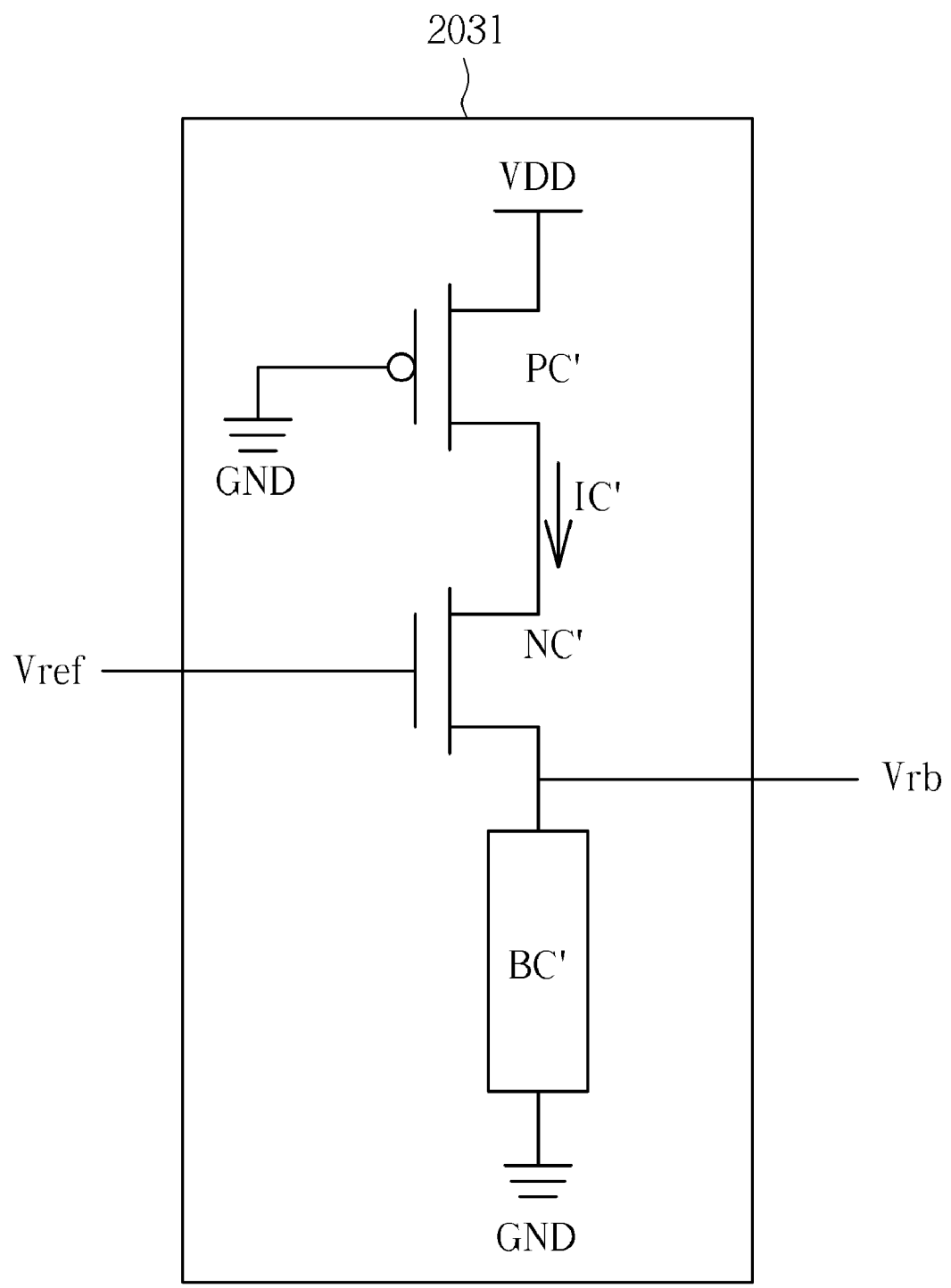
FIG. 4 is a schematic diagram of a first half-circuit in FIG. 2 according to an embodiment of the present invention.

Please refer to FIG. 4 in conjunction with FIG. 2. FIG. 4 is a schematic diagram of the first half-circuit 2031 in FIG. 2 according to an embodiment of the present invention. The first half-circuit 2031 includes a bias component BC', an input transistor PC' and a driving transistor NC'. The bias component BC' has a first node for delivering a reference input current IC' and a second node coupled to the second reference voltage (i.e., the reference ground) wherein the reference input current IC' is proportional to the first driving current IC1 of the control circuit 202 with a second specific ratio R2. The input transistor PC' has a control node for receiving the second reference voltage (i.e., GND), a first node coupled to the first reference voltage (i.e., VDD), and a second node for delivering the reference input current IC', wherein an aspect ratio of the input transistor PC' is proportional to an aspect ratio of the first input transistor PC1 (or the second input transistor PC2) of the control circuit 202 by the second specific ratio R2. The driving transistor NC' has a control node coupled to the reference bias voltage Vref, a first node for receiving the reference input current IC', and a second node for delivering the reference driving voltage Vrd to the second half-circuit 2032, wherein an aspect ratio of the driving transistor NC' is proportional to the aspect ratio of the first driving transistor NC1 (or the second driving transistor NC2) of the control circuit 202 by the second specific ratio R2.

Figure 5:
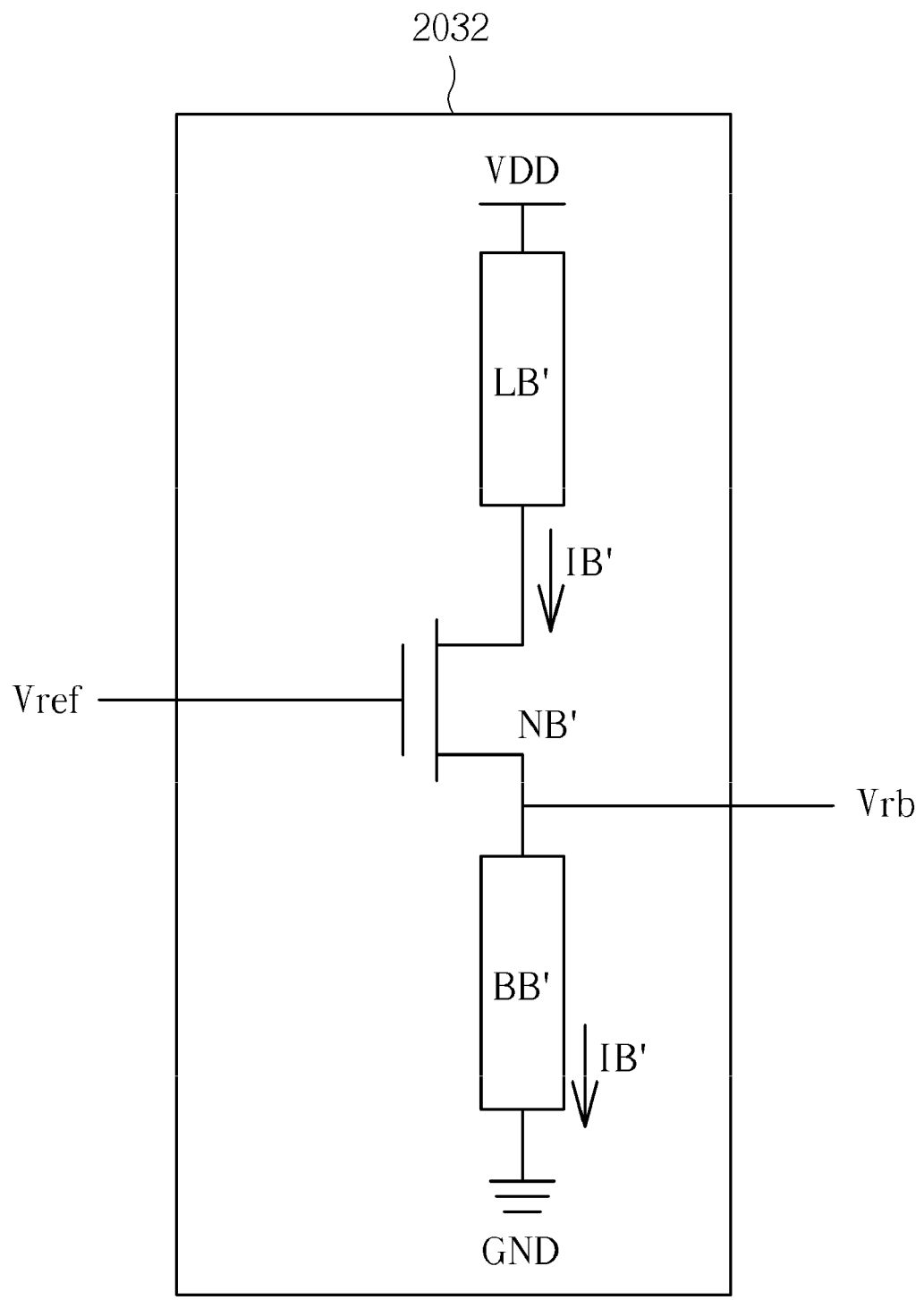
FIG. 5 is a schematic diagram of a second half-circuit in FIG. 2 according to an embodiment of the present invention.

Please refer to FIG. 5 in conjunction with FIG. 2. FIG. 5 is a schematic diagram of the second half-circuit 2032 in FIG. 2 according to an embodiment of the present invention. The second half-circuit 2032 includes a loading component LB', a bias component BB' and a MOS transistor NB'. The loading component LB' has a first node coupled to the first reference voltage (i.e., VDD) and a second node for sourcing a unit bias current IB', wherein the unit bias current IB' is proportional to the bias current IB of the output stage 201 by the second specific ratio R2. The bias component BB' has a first node for draining the unit bias current IB' and a second node coupled to the second reference voltage (i.e., GND). The MOS transistor NB' has a control node for receiving the reference driving voltage Vrd generated from the first half-circuit 2031, a first node coupled to the second node of the loading component LB' and a second node coupled to the first node of the bias component BB', wherein an aspect ratio of the MOS transistor NB' is proportional to the aspect ratio of the first MOS transistor NB1 (or the second MOS transistor NB2) of the output stage 201 by the second specific ratio R2.

From the descriptions above, it should be obvious that the first half-circuit 2031 and the second half-circuit 2032 match the control circuit 202 and the output stage 201, respectively. Therefore, a negative feedback loop, which is formed by the voltage divider 2033, the OP amp 2034, the first half-circuit 2031 and the second half-circuit 2032, can readily track the variation of the common mode voltage at the output terminals of the output stage 201. With the help of the reference circuit 203, the common mode voltage of the output terminals of the output stage 201 can be stabilized and a better performance can be achieved.

To summarize, the present invention provides a CML driver capable of forcing inherent switching transistors to enter saturation regions instead of a linear region with the help of a matched control circuit. Furthermore, by adding a reference circuit to trace output signals of the CML driver, the common mode voltage of output terminals of the CML driver can be stabilized and therefore a better performance can be achieved.

Those skilled in the art will readily observe that numerous modifications and alterations of the device and method may be made while retaining the teachings of the invention.

What is claimed is:

1. A differential CML (common mode logic) driver, comprising:
   an output stage, comprising:
      a first loading component, having a first node coupled to a first reference voltage and a second node for outputting a first output voltage;
      a second loading component, having a first node coupled to the first reference voltage and a second node for outputting a second output voltage;
      a bias component, having a first node for conducting a bias current and a second node coupled to a second reference voltage;
      a first metal-oxide-semiconductor (MOS) transistor, having a control node for receiving a first driving signal, a first node coupled to the second node of the first loading component and a second node coupled to the first node of the bias component; and
      a second MOS transistor, having a control node for receiving a second driving signal, a first node coupled to the second node of the second loading component and a second node coupled to the first node of the bias component;
   a control circuit, coupled to the output stage, for receiving a reference bias voltage, a first input signal and a second input signal to make one of the first MOS transistor and the second MOS transistor enter a cut-off region and the other of the first MOS transistor and the second MOS transistor enter a saturation region; and
   a reference circuit, coupled to the output stage and the control circuit, for generating a common-mode voltage according to the first output voltage and the second output voltage of the output stage, and outputting the reference bias voltage to the control circuit according to the common-mode voltage.

2. The differential CML driver of claim 1, wherein the bias component is a current source.

3. The differential CML driver of claim 1, wherein the control circuit comprises:
   a first bias component, having a first node to drain a first input current and a second node coupled to the second reference voltage, wherein the first input current is proportional to the bias current of the output stage by a first specific ratio;
   a second bias component, having a first node to drain a second input current and a second node coupled to the second reference voltage, wherein the second input current is proportional to the bias current of the output stage by the first specific ratio;
   a first input transistor, having a control node for receiving the first input signal, a first node coupled to the first reference voltage and a second node for delivering the first input current;
   a second input transistor, having a control node for receiving the second input signal, a first node coupled to the first reference voltage, and a second node for delivering the second input current;
   a first driving transistor, having a control node for receiving the reference bias voltage from the reference circuit, a first node coupled to the second node of the first input transistor, and a second node for delivering the first driving signal to the first MOS transistor of the output stage, wherein an aspect ratio of the first driving transistor is proportional to an aspect ratio of the first MOS transistor of the output stage by the first specific ratio; and
   a second driving transistor, having a control node for receiving the reference bias voltage from the reference circuit, a first node coupled to the second node of the second input transistor, and a second node for delivering the second driving signal to the second MOS transistor of the output stage, wherein an aspect ratio of the second driving transistor is proportional to an aspect ratio of the second MOS transistor of the output stage by the first specific ratio.

4. The differential CML driver of claim 1, wherein each of the first bias component and the second bias component is a current source.

5. The differential CML driver of claim 3, wherein the reference circuit comprises:
   a voltage divider, for receiving the first output voltage and the second output voltage of the output stage to generate the common-mode voltage which is proportional to an average of the first output voltage and the second output voltage of the output stage;
   an operational amplifier (OP amp), for receiving the common-mode voltage and a feedback voltage to generate the reference bias voltage;
   a first half-circuit, for receiving the reference bias voltage to generate a reference driving voltage; and
   a second half-circuit, for receiving the reference driving voltage to generate the feedback voltage.

6. The differential CML driver of claim 5, wherein the first half-circuit comprises:
   a bias component, having a first node for delivering a reference input current and a second node coupled to the second reference voltage, wherein the reference input current is proportional to the first driving current of the control circuit by a second specific ratio;
   an input transistor, having a control node coupled to the second reference voltage, a first node coupled to the first reference voltage, and a second node for delivering the reference input current, wherein an aspect ratio of the input transistor is proportional to an aspect ratio of the first input transistor of the control circuit by the second specific ratio; and
   a driving transistor, having a control node coupled to the reference bias voltage, a first node for receiving the reference input current, and a second node for delivering the reference driving voltage to the second half-circuit, wherein an aspect ratio of the driving transistor is proportional to the aspect ratio of the first driving transistor of the control circuit by the second specific ratio.

7. The differential CML driver of claim 6, wherein the bias component of the first half-circuit is a current source.

8. The differential CML driver of claim 5, wherein the second half-circuit comprises:
   a loading component, having a first node coupled to the first reference voltage and a second node for sourcing a unit bias current, wherein the unit bias current is proportional to the bias current of the output stage by a second specific ratio;
   a bias component, having a first node for draining the unit bias current and a second node coupled to the second reference voltage; and
   a MOS transistor, having a control node for receiving the reference driving voltage, a first node coupled to the second node coupled to the loading component and a second node coupled to the first node of the bias component, wherein an aspect ratio of the MOS transistor is proportional to the aspect ratio of the first MOS transistor of the output stage by the second specific ratio.

9. The differential CML driver of claim 8, wherein each of the loading component and the bias component of the second half-circuit is a current source.

10. A differential CML (common mode logic) driver, comprising:
   an output stage, comprising:
      a first loading component, having a first node coupled to a first reference voltage and a second node for outputting a first output voltage;
      a second loading component, having a first node coupled to the first reference voltage and a second node for outputting a second output voltage;
      a bias component, having a first node for conducting a bias current and a second node coupled to a second reference voltage;
      a first metal-oxide-semiconductor (MOS) transistor, having a control node for receiving a first driving signal, a first node coupled to the second node of the first loading component and a second node coupled to the first node of the bias component; and
      a second MOS transistor, having a control node for receiving a second driving signal, a first node coupled to the second node of the second loading component and a second node coupled to the first node of the bias component;
   a control circuit, coupled to the output stage, comprising:
      a first bias component, having a first node to drain a first input current and a second node coupled to the second reference voltage, wherein the first input current is proportional to the bias current of the output stage by a first specific ratio;
      a second bias component, having a first node to drain a second input current and a second node coupled to the second reference voltage, wherein the second input current is proportional to the bias current of the output stage by the first specific ratio;
      a first input transistor, having a control node for receiving the first input signal, a first node coupled to the first reference voltage and a second node for delivering the first input current;
      a second input transistor, having a control node for receiving the second input signal, a first node coupled to the first reference voltage, and a second node for delivering the second input current;
      a first driving transistor, having a control node for receiving a reference bias voltage from the reference circuit, a first node coupled to the second node of the first input transistor, and a second node for delivering the first driving signal to the first MOS transistor of the output stage, wherein an aspect ratio of the first driving transistor is proportional to an aspect ratio of the first MOS transistor of the output stage by the first specific ratio; and
      a second driving transistor, having a control node for receiving the reference bias voltage from the reference circuit, a first node coupled to the second node of the second input transistor, and a second node for delivering the second driving signal to the second MOS transistor of the output stage, wherein an aspect ratio of the second driving transistor is proportional to an aspect ratio of the second MOS transistor of the output stage by the first specific ratio; and
   a reference circuit, coupled to the output stage and the control circuit, for generating a common-mode voltage according to the first output voltage and the second output voltage of the output stage, and outputting the reference bias voltage to the control circuit according to the common-mode voltage.

11. The differential CML driver of claim 10, wherein each of the bias component, the first bias component, and the second bias component is a current source.

12. The differential CML driver of claim 10, wherein the reference circuit comprises:
   a voltage divider, for receiving the first output voltage and the second output voltage of the output stage to generate the common-mode voltage which is proportional to an average of the first output voltage and the second output voltage of the output stage;
   an operational amplifier (OP amp), for receiving the common-mode voltage and a feedback voltage to generate the reference bias voltage;
   a first half-circuit, for receiving the reference bias voltage to generate a reference driving voltage; and
   a second half-circuit, for receiving the reference driving voltage to generate the feedback voltage.

13. The differential CML driver of claim 12, wherein the first half-circuit comprises:
   a bias component, having a first node for delivering a reference input current and a second node coupled to the second reference voltage, wherein the reference input current is proportional to the first driving current of the control circuit by a second specific ratio;
   an input transistor, having a control node coupled to the second reference voltage, a first node coupled to the first reference voltage, and a second node for delivering the reference input current, wherein an aspect ratio of the input transistor is proportional to an aspect ratio of the first input transistor of the control circuit by the second specific ratio; and
   a driving transistor, having a control node coupled to the reference bias voltage, a first node for receiving the reference input current, and a second node for delivering the reference driving voltage to the second half-circuit, wherein an aspect ratio of the driving transistor is proportional to the aspect ratio of the first driving transistor of the control circuit by the second specific ratio.

14. The differential CML driver of claim 13, wherein the bias component of the first half-circuit is a current source.

15. The differential CML driver of claim 12, wherein the second half-circuit comprises:
   a loading component, having a first node coupled to the first reference voltage and a second node for sourcing a unit bias current, wherein the unit bias current is proportional to the bias current of the output stage by a second specific ratio;
   a bias component, having a first node for draining the unit bias current and a second node coupled to the second reference voltage; and
   a MOS transistor, having a control node for receiving the reference driving voltage, a first node coupled to the second node coupled to the loading component and a second node coupled to the first node of the bias component, wherein an aspect ratio of the MOS transistor is proportional to the aspect ratio of the first MOS transistor of the output stage by the second specific ratio.

16. The differential CML driver of claim 15, wherein each of the loading component and the bias component of the second half-circuit is a current source.

* * * * *